(12) United States Patent
Mau et al.

(10) Patent No.: US 6,866,801 B1
(45) Date of Patent: Mar. 15, 2005

(54) PROCESS FOR MAKING ALIGNED CARBON NANOTUBES (75) Inventors: Albert Mau, Wheelers Hill (AU); Li-ming Dai, Clayton (AU); Shaoming Huang, Clayton (AU)

(73) Assignee: Commonwealth Scientific and Industrial Research Organisation, Australian Capital Territory (AU)

( * ) Notice: Subject to any disclaimer, the term of this patent is extended or adjusted under 35 U.S.C. 154(b) by 239 days.

(21) Appl. No.: 10/088,737

(22) PCT Filed: Sep. 22, 2000

(86) PCT No.: PCT/AU00/01180

§ 371 (c)(1),
(2), (4) Date: Jun. 19, 2002

(87) PCT Pub. No.: WO01/21863

PCT Pub. Date: Mar. 29, 2001

(30) Foreign Application Priority Data

Sep. 23, 1999 (AU) .............................................. PQ3041

(51) Int. Cl.[7] ............................ B82B 3/00; C01B 31/02
(52) U.S. Cl. ........................ 264/29.1; 264/81; 264/319; 423/445 B; 977/DIG. 1
(58) Field of Search ........................ 264/29.1, 81, 319; 423/445 B (56) References Cited

U.S. PATENT DOCUMENTS

| 5,726,524 A | 3/1998 | Debe |
| 5,872,422 A | 2/1999 | Xu et al. |
| 5,973,444 A | 10/1999 | Xu et al. |
| 6,062,931 A | 5/2000 | Chuang et al. |
| 6,097,138 A * | 8/2000 | Nakamoto .................. 313/309 |
| 6,628,053 B1 * | 9/2003 | Den et al. .................... 313/310 |

FOREIGN PATENT DOCUMENTS

| EP | 0 947 466 A1 | 10/1999 |
| EP | 951047 A2 | 10/1999 |
| JP | 2000-031462 A | 1/2000 |
| WO | WO 98/42620 A1 | 10/1998 |
| WO | WO 99/65821 A1 | 12/1999 |
| WO | WO 00/09443 A1 | 2/2000 |
| WO | WO 00/17102 A1 | 3/2000 |
| WO | WO 00/30141 A1 | 5/2000 |

OTHER PUBLICATIONS

International Search Report dated Nov. 8, 2000.
Chemical Physics Letters 316 (2000) 349–355 Jan. 21, 2000, Structure and Growth of Aligned Carbon Nanotube Films by Pyrolysis, D–C. Li.

* cited by examiner

Primary Examiner—Leo B. Tentoni
(74) Attorney, Agent, or Firm—Sughrue Mion, PLLC (57) ABSTRACT A process for preparing a patterned layer of aligned carbon nanotubes on a substrate including: applying a pattern of polymeric material to the surface of a substrate capable of supporting nanotube growth using a soft-lithographic technique; subjecting said polymeric material to carbonization to form a patterned layer of carbonized polymer on the surface of the substrate; synthesising a layer of aligned carbon nanotubes on regions of said substrate to which carbonized polymer is not attached to provide a patterned layer of aligned carbon nanotubes on said substrate.

40 Claims, 6 Drawing Sheets

PROCESS FOR MAKING ALIGNED CARBON NANOTUBES

BACKGROUND OF THE INVENTION

This is a National Stage entry under 35 U.S.C. § 371 of Application No. PCT/AU00/001180 filed Sep. 22, 2000, and the complete disclosure of which is incorporated into this application by reference.

This invention relates to carbon nanotube materials and processes for their preparation. In particular the invention relates to patterned aligned carbon nanotubes and to processes for their preparation which involve the use of a soft-lithographic technique. The invention also relates to the construction of various electronic and photonic devices from such materials for practical applications in many area including as electron field emitters, artificial actuators, chemical sensors, gas storages, molecular filtration membranes, energy absorbing materials, molecular transistors and other opto electronic devices.

SUMMARY OF THE INVENTION

Soft-lithography has recently become a very promising technique for micro-/nano-structuring a wide range of materials (see, for example: Xia, Y.; Whitesides, G. M. *Annu. Rev. Mater. Sci.* 1988, 28, 153). Various strategies, including micro-contact prining ($\mu$CP), mechanical scraping, and micro-molding, have been developed for nanoscale patterning that otherwise is difficult by photolithographic techniques (see, for example: Dai, L. J. *Macromol. Sci., Rev. Macromol. Chem. Phys.* 1999, 39, 273, and references cited therein). In particular, micro-contact printing ($\mu$CP) has been demonstrated to be a very convenient pattering technique for generating self-assembled monolayer (SAM) patterns of certain molecular "inks" (e.g. alkanethiol, alkylsiloxane) on an appropriate substrate surface (e.g. gold, silver, copper, aluminium, and silicon dioxide surfaces) using an elastomeric stamp (typically, a polydimethylsiloxane (PDMS) stamp) for a region-specific transfer of the SAM material. On the other hand, the solvent-assisted micromolding (SAMIM) technique allows pattern formation through confined solvent evaporation from a thin layer of polymer solution sandwiched between a PDMS elastomer mold and substrate surface. However, it has been a major challenge for researchers to find ways to control the arrangement of carbon nanotubes.

Carbon nanotubes usually have a diameter in the order of tens of angstroms and the length of up to several micrometers. These elongated nanotubes consist of carbon hexagons arranged in a concentric manner with both ends of the tubes normally capped by pentagon-containing, fullerene-like structures. They can behave as a semiconductor or metal depending on their diameter and helicity of the arrangement of graphitic rings in the walls, and dissimilar carbon nanotubes may be joined together allowing the formation of molecular wires with interesting electrical, magnetic, non-linear optical, thermal and mechanical properties. These unusual properties have led to diverse potential applications for carbon nanotubes in material science and nanotechnology. Indeed, carbon nanotubes have been proposed as new materials for electron field emitters in panel displays, single-molecular transistors, scanning probe microscope tips, gas and electrochemical energy storages, catalyst and proteins/DNA supports, molecular-filtration membranes, and energy-absorbing materials (see, for example: M. Dresselhaus, et al., *Phys. World*, January, 33, 1998; P. M. Ajayan, and T. W. Ebbesen, *Rep. Prog. Phys.*, 60, 1027, 1997; R. Dagani, *C&E News*, Jan. 11, 31, 1999).

For most of the above applications, it is highly desirable to prepare aligned carbon nanotubes so that the properties of individual nanotubes can be easily assessed and they can be incorporated effectively into devices. Carbon nanotubes synthesised by most of the common techniques, such as arc discharge, often exist in a randomly entangled state. However, aligned carbon nanotubes have recently been prepared either by post-synthesis manipulation or by synthesis-induced alignment (see, for example: S. Huang, L. Dai and A. W. H. Mau H, J. *Mater. Chem.* (1999), 9, 1221 and references cited therein).

The number of techniques which have been reported for the pattern formation of aligned carbon nanotubes is very limited (S. Fan, M. G. Chapline, N. R. Franklin, T. W. Tombler, A. M. Cassell, and H. Dai, *Science*, 283, 512, 1999; S. Huang, L. Dai, and A. W. H. Mau, J. *Phys, Chem.*, 103 issue 21, 4223–4227), and the achievable resolutions of the nanotube patterns was, at the best, at several micrometer scale in these cases.

It has now been found that pattern formation of perpendicularly aligned carbon nanotubes with resolutions up to a sub-micrometer scale can be achieved using a novel soft-lithographic technique.

According to a first aspect, the present invention provides a process for preparing a patterned layer of aligned carbon nanotubes on a substrate including:

applying a pattern of polymeric material to the surface of a substrate capable of supporting nanotube growth using a soft-lithographic technique, subjecting said polymeric material to carbonization to form a patterned layer of carbonized polymer on the surface of the substrate, synthesising a layer of aligned carbon nanotubes on regions of said substrate to which carbonised polymer is not attached to provide a patterned layer of aligned carbon nanotubes on said substrate.

The polymeric material may be any polymer capable of being applied to the substrate surface in the form of a pattern using a soft-lithographic technique, and which is capable of undergoing carbonization. The pattern of carbonized polymer so formed should correspond to the pattern of polymer applied to the substrate using the soft-lithographic technique. Examples of suitable polymers include, but are not limited to, photoresist or photoresponsive materials, such as diazonaphtoquinone (DNQ)-based photo resists (e.g. cresol novolak resin from Shipley, Ozatec PK 14 from Hoechst), as well as other possible polymers including, inter alia, epoxy resins, PEO, polyanilines, polymethyl methacrylate, polystyrenes, polydienes and plasma polymers derived from saturated or unsaturated alcohols, ketones, aldehydes, amines or amides. Preferably the polymer is a diazonaphaquinone (DNQ)-modified cresol novolak photoresist.

The substrate to which the polymer patterned layer is applied can be any substrate which is capable of withstanding the pyrolysis conditions employed, and capable of supporting aligned carbon nanotube growth. Examples of suitable substrates include all types of glass that provide sufficient thermal stability according to the synthesis temperature applied, such as quartz glass, as well as alumina, graphite, mica, mesaporous silica, silicon wafer, nanoporous alumina or ceramic plates. Preferably the substrate is glass, in particular, quartz glass or silicon wafer. The substrate may also include a coating of a material which is capable of supporting carbon nanotube growth under the conditions employed. The coating may be of any metal, metal oxide, metal alloy or compound thereof, which may have conducting or semiconducting properties. Examples of suitable metals include Au, Pt, Cu, Cr, Ni, Fe, Co and Pd. Examples of suitable compounds are metaloxides, metal carbides, metal nitrides, metal sulfides and metal borides. Examples of suitable metal oxides include indium tin oxide (ITO), $Al_2O_3$, $TiO_2$ and MgO. Examples of semiconducting materials include gallium arsenide, aluminium arsenide, aluminium sulphide and gallium sulphide.

The patterning of the aligned carbon nanotubes is achieved by creating a region on the substrate which is incapable of supporting nanotube growth. The pattern is created on the substrate using an appropriate soft-lithographic technique. Examples of suitable soft-lithographic techniques include micro-contact printing ($\mu$CP) and micro-molding.

In one embodiment the micro-contact printing process involves the region-specific transfer of self-assembling monolayers (SAMs) of a molecular "ink", such as alkylsiloxane, onto a suitable substrate, followed by subsequent adsorption of the polymer in the SAM-free regions. The transfer of the self-assembling monolayer may be achieved using an appropriate stamp, such as a polydimethylsiloxane (PDMS) stamp. Other processes which involve region-specific transfer of a material which alters the hydrophobicity or hydrophilicity of the substrate surface may also be used, provided the transfer allows subsequent adsorption of the polymer in the more hydrophobic regions of the substrate surface. Using pre-patterned substrates the polymer patterns may also be prepared by a layer by layer adsorption process through, for example, electrostatic attraction or hydrogen bonding interactions. Furthermore, plasma patterning can be used for the same purpose.

Examples of suitable molecular "inks" include alkanethiols, organosilanes, and their derivatives, polyelectrolytes, H-bonding molecules, etc.

In another embodiment of the invention the pattern is applied to the substrate using a micro-molding technique. This allows the formation of a patterned polymer coating on the substrate through confined solvent evaporation from a thin layer of polymer solution sandwiched between a mold, such as an elastomeric mold, and the substrate surface. The elastomeric mold may be made of any suitable material, such as PDMS, fluorocarbon or other solvent resistant elastomers. The mould surface has incised areas corresponding to the pattern desired which provide channels for the "ink".

Once the polymer pattern is applied to the substrate, the patterned substrate is heated to a temperature at or above the temperature at which the polymer decomposes thereby forming a carbonised pattern on the substrate. In some circumstances it is desirable to heat the polymer material at one or more temperatures below the decomposition temperature of the polymer material. Such heating can stabilise the polymer (e.g. by cross-linking etc.) such that the carbonised polymer pattern remains substantially intact during subsequent pyrolysis.

The next step in the process involves the synthesis of a layer of aligned carbon nanotubes on the region of the substrate to which the carbonised polymer is not attached. This may be achieved using a suitable technique for the synthesis of perpendicularly aligned carbon nanotubes. Preferably the aligned carbon nanotubes are prepared by pyrolysis of a carbon-containing material in the presence of a suitable catalyst for nanotube formation.

The carbon-containing material may be any compound or substance which includes carbon and which is capable for forming carbon nanotubes when subjected to pyrolysis in the presence of a suitable catalyst. Examples of suitable carbon-containing materials include alkanes, alkenes, alkynes or aromatic hydrocarbons and their derivatives, for example organometallic compounds of transition metals, for example methane, acetylene, benzene, transition metal phthalocyanines, such as Fe(II) phthalocyanine, and metallocenes such as ferrocene and nickel dicyclopentadiene and any other suitable evaporable metal complex.

The catalyst may be any compound, element or substance suitable for catalysing the conversion of a carbon-containing material to aligned carbon nanotubes under pyrolytic conditions. The catalyst may be a transition metal, such as Fe, Co, Al, Ni, Mn, Pd, Cr or alloys thereof in any suitable oxidation state.

The catalyst may be incorporated into the substrate or may be included in the carbon-containing material. Examples of carbon-containing materials which include a transition metal catalyst are Fe(II) phthalocyanine, Ni(II) phthalocyanine and ferrocene. When the catalyst and carbon-containing material are included in the same material it may be necessary to provide sources of additional catalyst or additional carbon-containing material. For example, when ferrocene is used as the catalyst and a source of carbon, it is necessary to provide an additional carbon source, such as ethylene, to obtain the required nanotube growth.

The pyrolysis condition employed will depend on the type of carbon-containing material employed and the type of catalyst, as well as the length and density of the nanotubes required. In this regard it is possible to vary the pyrolysis conditions, such as the temperature, time, pressure or flow rate through the pyrolysis reactor, to obtain nanotubes having different characteristics.

For example, performing the pyrolysis at a higher temperature may produce nanotubes having different base-end structures relative to those prepared at a lower temperature. The pyrolysis will generally be performed within a temperature range of 500° C. to 1100° C. Similarly lowering the flow rate through a flow-type pyrolysis reactor may result in a smaller packing density of the nanotubes and vice versa. A person skilled in the art would be able to select and control the conditions of pyrolysis to obtain nanotubes having the desired characteristics.

After synthesis of the layer of aligned carbon nanotubes in the patterned array on the substrate, the carbonised polymer remaining on the substrate may be dissociated from the carbon nanotubes. This may be achieved by plasma etching. Alternatively it is possible to disassociate the carbon nanotubes from the substrate by transferring the patterned carbon nanotube layer to another substrate. This other substrate may be another substrate capable of supporting carbon nanotube growth, or may be a metal, metal oxide, semi-conductor material or a polymer. Examples of suitable polymers include adhesive coated polymers such as cellulose tape, conjugated (conducting) polymers, temperature/pressure responsive polymers, bioactive polymers and engineering resins.

Where the patterned layer of aligned carbon nanotubes is transferred to another substrate which is capable of supporting carbon nanotube growth, it is possible to form a heterostructured nanotube film by subjecting the nanotube coated substrate to conditions for promoting aligned carbon nanotube growth. The conditions of nanotube formation may be controlled or adjusted such that the length of the further nanotubes is different to the length of the nanotubes making up the original patterned layer. This second layer of nanotubes will tend to grow in the spaces defined by the original patterned layer. It may also be possible to adjust conditions such that there is some further nanotube growth on top of the original patterned layer.

The nanotube patterns on quartz plates may also be separated from the substrate, while retaining the integrity of the pattern by immersing the sample in an aqueous hydrofluoric acid solution (10–40% w/w) for an appropriate period.

For some applications, the patterned carbon nanotube film may be incorporated into a multilayer structure including layers of other materials, such as metals, metal oxides, semiconductor materials or polymers.

The patterned carbon nanotube film prepared in accordance with the present invention and the devices including these patterned films represent further aspect of the present invention.

The patterned film prepared in accordance with any one of the processes of the present invention and devices, materials coated with or including these multilayer films represent further aspects of the present invention.

As is evident from the above description the invention allows the preparation of a large variety of patterned films and structures. The processes of the present invention and the patterned structures formed may have use in the following applications:
1) electron emitters
2) field-emission transistors
3) photovoltaic cells and light emitting diodes with region-specific characteristics, and electrodes therefore
4) optoelectronic elements
5) bismuth actuators
7) chemical and biological sensors with region-specific characteristics
8) gas storages
9) molecular-filtration membranes
10) region-specific energy absorbing materials
11) flexible optoelectronic devices.

The invention will now be described with reference to the following examples and drawings which illustrate some preferred embodiments of the invention. However it should be understood that the particularity of the following description is not to supersede the generality of the invention previously described.

BRIEF DESCRIPTION OF THE DRAWINGS

FIG. 4b is a scanning electron microscope image of the DNQ-novolak photoresist pattern preparing using a micro-molding technique with the stamp of FIG. 3a.

DETAILED DESCRIPTION OF THE INVENTION

Example 1

Quartz glass plates were cleaned by heating in a Pianha solution (a mixture of 98% $H_2SO_4$ and 30% $H_2O_2$ at 7:3 v/v) at 70° C. for ca. 30 min, followed by thoroughly rinsing with deionized water. PDMS stamp was used for patterning an octadecyltrichlorosiloxane (OST) SAM layer on the cleaned quartz surface. After the contact transfer of the "ink" (i.e. 0.2% w/w of OST in hexane), the PDMS stamp was left in contact with the substrate for 15–30 seconds, and the patterned substrate was then immersed into a diazonaphthoquinone (DNQ)-modified cresol novolak photoresist solution (0.5~1.0 mg/ml) in ethoxyethyl acetate/acetone (1/10~1/5 v/v) for ca. Is for selective absorption of the polymer into the OST-free regions. The polymer prepatterned quartz plate was heated at high temperature under Ar atmosphere to carbonize the photoresist polymer into a carbon layer. The carbonization was carried out be heating the patterned DNQ-novolak photoresist coating at 150° C., 300° C., 500° C., 700° C. and 900° C. for 30 minutes at each temperature. Carbonization of certain polymers has previously been reported (see, for example: (a) Kyotani, T.; Nagai, T.; Inoue, S.; Tomita, A. Chem. Mater. 1997, 9,609. (b) Parthasarathy, R. V.; Phani, K. L. N.; Marin, C. R. Adv. Mater. 1995, 7, 896). The carbon nanotube patterns were then prepared by selectively growing aligned nanotubes in the photoresist-free regions by pyrolysis of FePc under $Ar/H_2$ at 800–1000° C.

Figure 2:
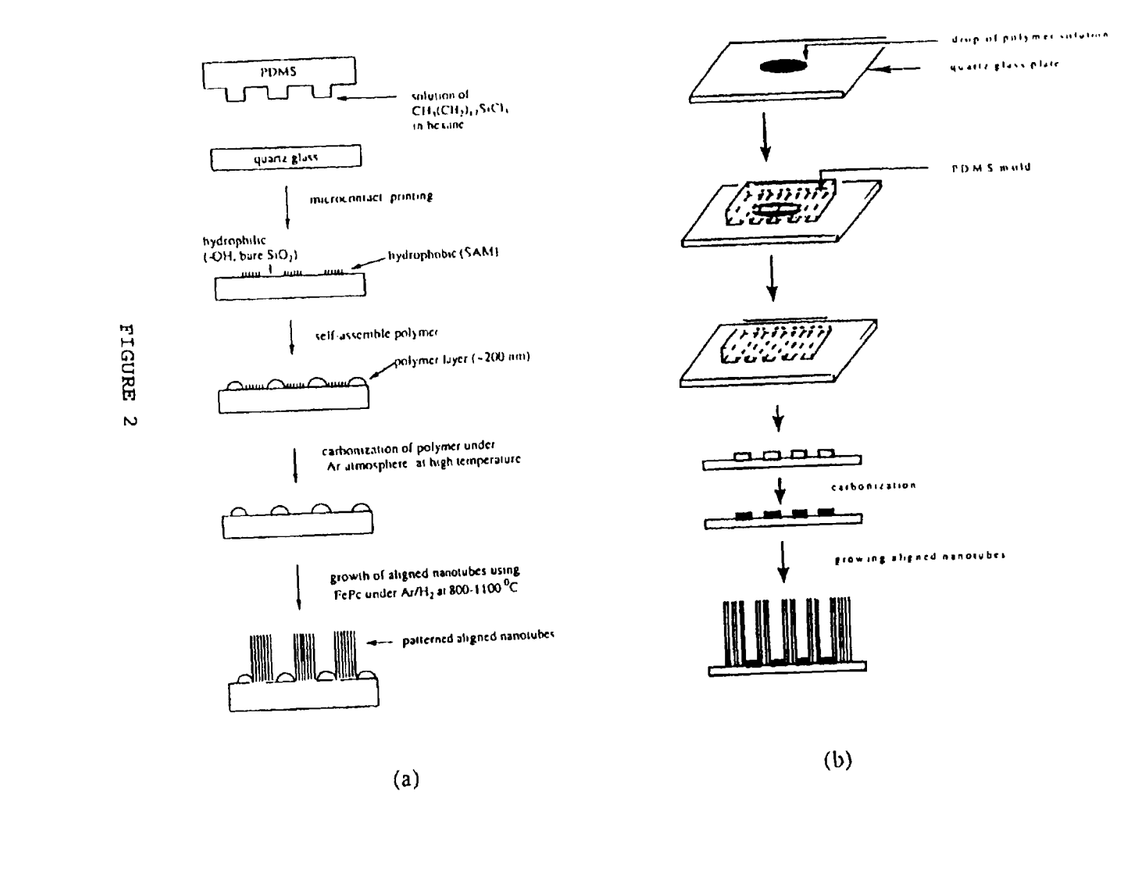
FIG. 2a is a schematic diagram showing the stages involved in the preparation of a patterned layer of aligned carbon nanotubes according to a micro-contact printing process.
FIG. 2b is a schematic diagram showing the stages involved in the preparation of a patterned layer of aligned carbon nanotubes according to a micro-molding technique.

FIGS. 2a & b represent typical scanning electron microscopic (SEM, XL-30 FEG SEM, Philips) images of patterned octadecylsiloxane SAMs on quartz glass plates and patterns of DNQ-novolak photoresist selectively-absorbed in the OTS-free regions. As can be seen, the patterned structures shown in FIGS. 2a & b are perfectly matched to each other with the photoresist lines interdispersed between the OTS lines in FIG. 2b. Upon heating the prepatterned quartz plate associated with FIG. 2b at high temperatures under Ar atmosphere, the DNQ-novolak photoresist layer was found to be carbonized into carbon black and remained on the quartz substrate while OTS molecules decomposed away from the surface. Carbonization of the photoresist polymer was, most probably, due to the crosslinking effect of sulfate species originated from the decomposition of o-diaxonaphoquinone groups, as the X-ray photoelectron spectroscopic (XPS, Kratos Analytical, monochromatized Al Kα at 200W) and energy dispersive X-ray (EDX) analyses on the carbonized layer indicated the presence of carbon with a trace amount of sulfate. FIG. 2c, together with the associated EDX profiles of C and Fe given in FIG. 2d, clearly shows that the carbon-surrounded Fe particles forme at the initial stage of the pyrolysis of FePc preferentially deposited in the regions uncovered by the carbonized polymer pattern, presumably caused by a localized surface energy effect associated with the prepatterned substrate. Further pyrolyzing FePc under Ar/$H_2$ at 800–1000° C., therefore, led to region-specific growth of aligned nanotubes in the polymer-free regions as the presence of metal catalysts is known to be mandatory for the nucleation and growth of carbon nanotubes by pyrolysis of FePc. FIG. 2e represents a typical SEM image for the aligned nanotube micropatterns thus prepared. The width of the aligned nanotube arrays in FIG. 2e is seen to be ca. 0.8 μm, which is almost the same value as that for OTS lines seen in FIGS. 2a & b. Inspection of FIG. 2e at a higher magnification (FIG. 2f) shows that the aligned nanotubes are densely packed along the line length, but only a few of the nanotubes were observed across the line width in some of the nanotube lines.

Example 2

A drop of the DNQ-novolak photoresist in the ethoxyethyl acetate/acetone (15~20% w/w) was spread on a quartz plate, and PDMS stamp was then pressed on the polymer coated quartz surface. After having dried in an oven at 80–100° C. for about 30 min, the PDMS stamp was removed leading to a polymer-patterned substrate. The polymer prepatterned quartz plate was heated at high temperature under Ar atmosphere to carbonize the photoresist polymer into a carbon layer. The carbon nanotube patterns were then prepared by selectively growing aligned nanotubes in the photoresist-free regions by pyrolysis of FePc under Ar/$H_2$ at 800–1000° C.

Figure 1:
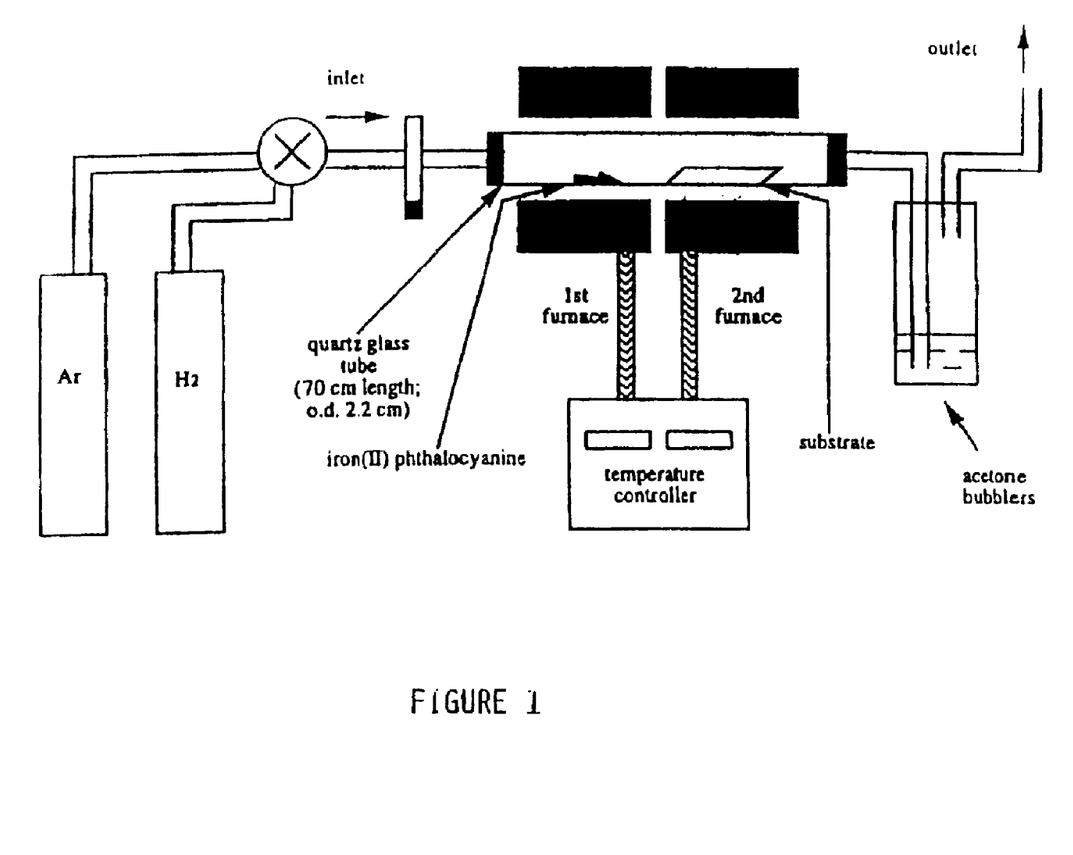
FIG. 1 is a diagrammatic representation of a pyrolysis flow reactor suitable for preparing aligned carbon nanotubes.
Figure 3A:
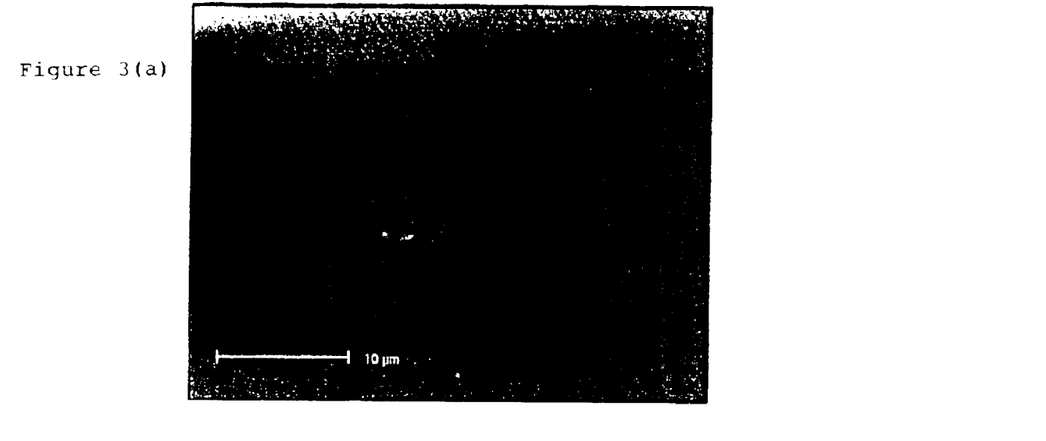
FIG. 3a is a scanning electron microscopic image of patterned octadecylsiloxane self assembling monolayers on quartz glass plates. The black and white lines represent $SiO_2$ and SAM respectively.
Figure 3B:
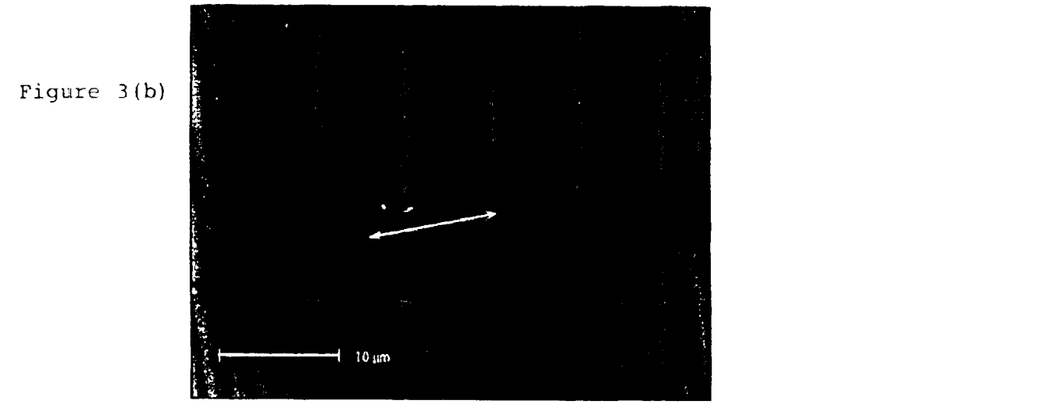
FIG. 3b is a scanning electron microscopic image of a pattern of DNQ-novolak photoresist selectively adsorbed in the OTS-free regions of the plate of FIG. 2A.
Figure 3C:
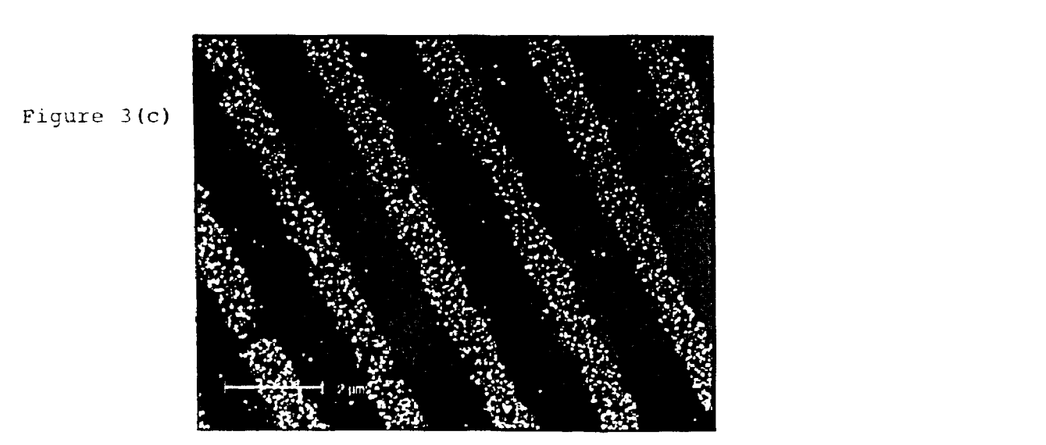
FIG. 3c is a scanning electron microscopic image of carbon-surrounded Fe particles selectively diffused in the polymer-free regions.
Figure 3D:
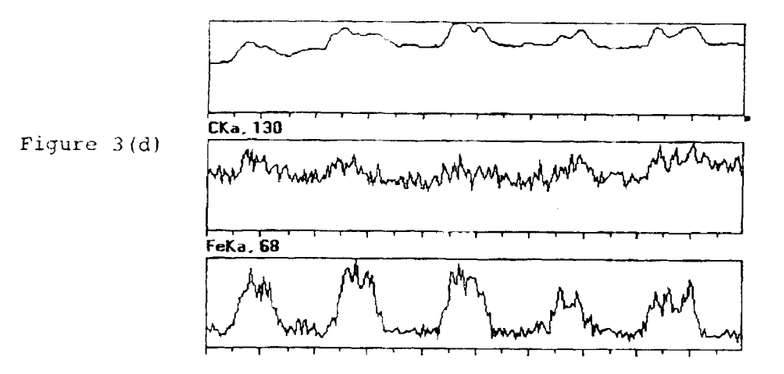
FIG. 3d is an EDX profile of C and Fe. The scanning path for the EDS analysers is indicated by the line between points A and B.
Figure 3E:
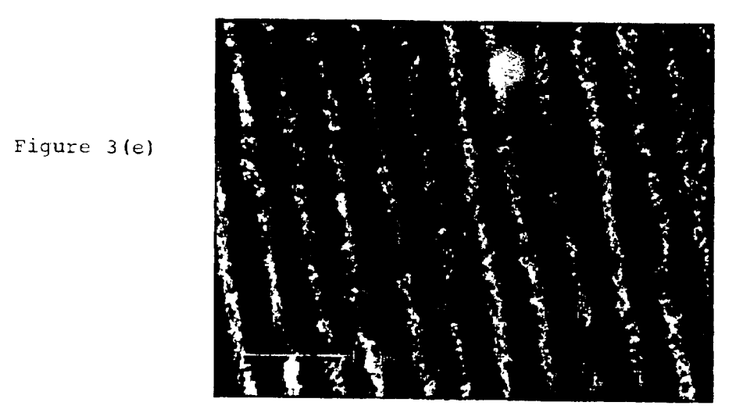
FIG. 3e is a scanning electron microscopic image of a pattern of aligned carbon nanotubes prepared using a micro-contact printing technique.
Figure 3F:
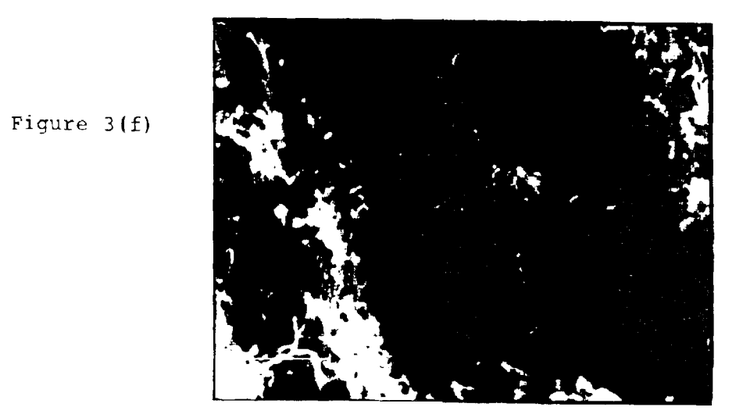
FIG. 3f is a high magnification image of the aligned carbon nanotube pattern of FIG. 3e.
Figure 4A:
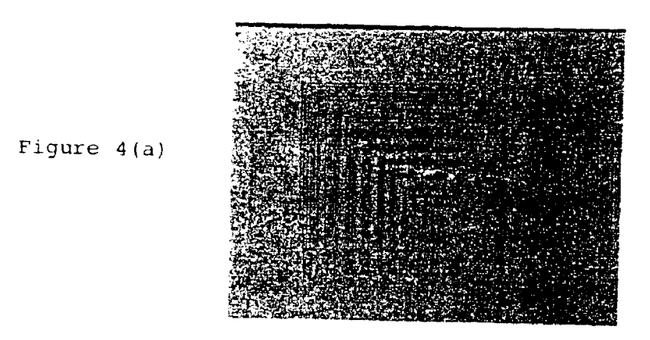
FIG. 4a is an optional microscopic image of the patterned surface of a PDMS mold.
Figure 4B:
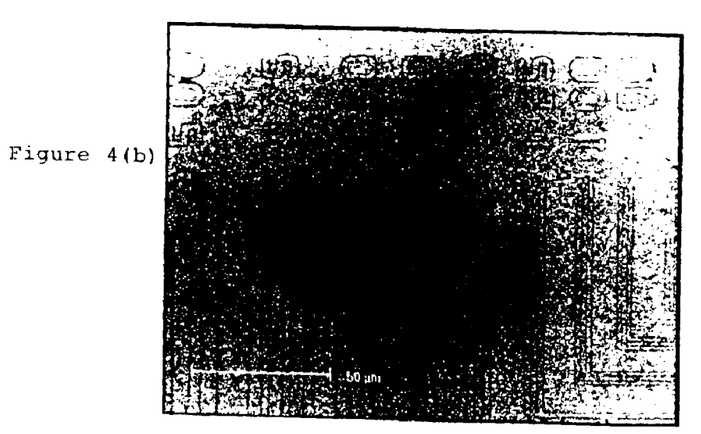
Figure 4C:
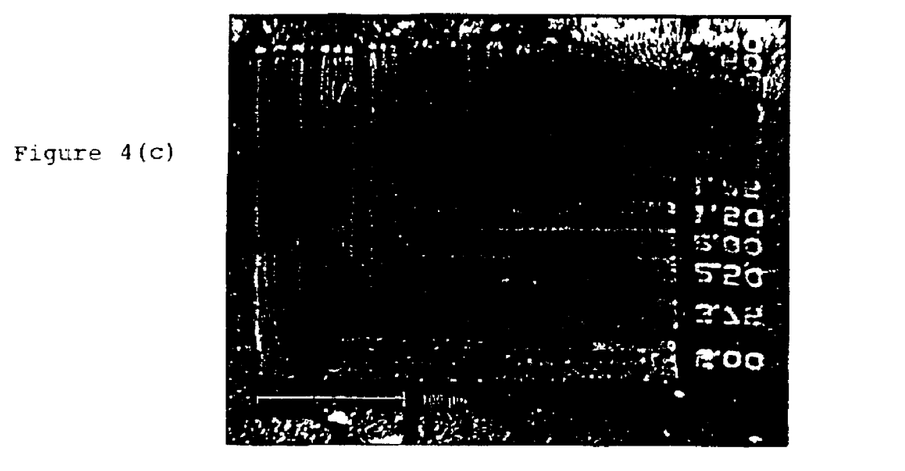
FIG. 4c is a scanning electron microscopic image of aligned carbon nanotube patterns prepared from the prepatterned substrate of FIG. 4b.
Figure 4D:
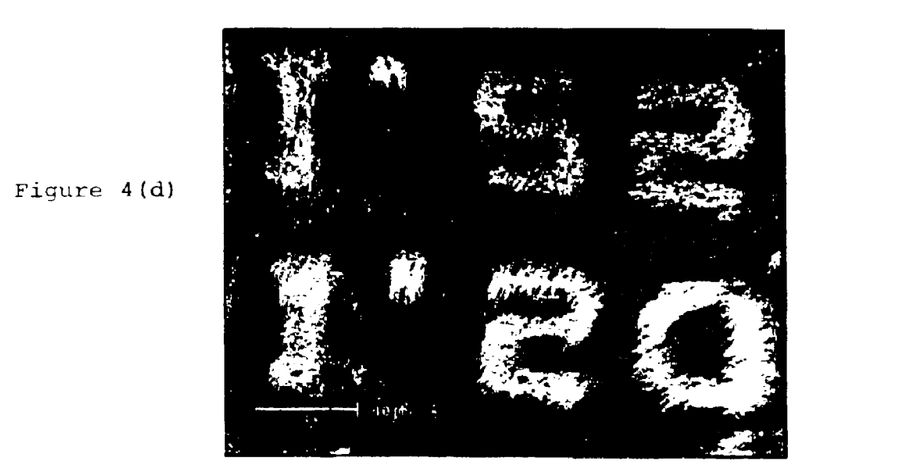
FIG. 4d is a higher magnification image of the pattern shown in FIG. 4c.

DNQ-novolak photoresist patterns were prepared by the solvent-assisted micro-molding (SAMIM) method illustrated in FIG. 1b. The structure of the PDMS mold used in this study is shown in FIG. 3a, while the corresponding SEM image of the resulting photoresist pattern is given in FIG. 3b. Prior to the region-specific growth of aligned nanotubes by pyrolysis of FePc under Ar/$H_2$ at 800–1000° C., the polymer patterned quartz plate was carbonized at high temperatures under Ar atmosphere as is the case with the micro-contact printing approach. FIGS. 3c & d show typical SEM images for the aligned nanotube patterns thus prepared. Unlike the micro-contact printing patterning, however, the micro-molding technique eliminates the SAM pattern formation and selective adsorption of DNQ-novolak photoresist chains involved in the micro-contact printing method, and hence serves as a more convenient approach for fabricating micro-/nano-patterns of the aligned nanotubes.

The present invention demonstrates the use of soft-lithographic techniques, including micro-contact printing and micro-molding, for fabricating patterned, perpendicular-aligned carbon nanotube arrays. The aligned nanotube patterns thus prepared could have resolutions down to sub-micrometer scale. These facile methods for generating micro-/nano-patterns of aligned nanotubes suitable for device fabrication could open avenues for fabricating various nanodevices for a wide range of potential applications ranging from novel electron emitters in flat panel displays (de Heer, W. A.; Bonard, J.-M.; Fauth, K.; Châtelain, A.; Forró, L; Ugarte, D. *Adv. Mater.* 1997, 9, 87) to artificial muscles (Baughman, R. H.; Changxing, C.; Zakhidov, A. A.; Iqbal, Z.; Barisci, J. N.; Spinks, G. M.; Wallace, G. G.; Mazzoldi, A.; de Rossi, D.; Rinzier, A. G.; Jaschinski, O.; Roth, S.; Kertesz, M. *Science* 1999, 284, 1340.

Throughout this specification and the claims which follow, unless the context requires otherwise, the word "comprise", and variations such as "comprises" and "comprising", will be understood to imply the inclusion of a stated integer or step or group of integers or steps but not the exclusion of any other integer or step or group of integers or steps.

Those skilled in the art will appreciate that the invention described herein is susceptible to variations and modifications other than those specifically described. It is to be understood that the invention includes all such variations and modifications. The invention also includes all of the steps, features, compositions and compounds referred to or indicated in this specification, individually or collectively, and any and all combinations of any two or more of said steps or features.

What is claimed is:

1. A process for preparing a patterned layer of aligned carbon nanotubes on a substrate including:

applying a pattern of polymeric material to the surface of a substrate capable of supporting nanotube growth using a soft-lithographic technique;

subjecting said polymeric material to carbonization to form a patterned layer of carbonized polymer on the surface of the substrate; and synthesising a layer of aligned carbon nanotubes on regions of said substrate to which carbonised polymer is not attached to provide a patterned layer of aligned carbon nanotubes on said substrate.

2. A process according to claim 1 wherein the polymeric material is a photoresist or photoresponsive material.

3. The process according to claim 2 wherein the polymeric material is (DNQ)-modified cresol novolac resin.

4. A process according to claim 1 wherein the polymeric material is selected from the group consisting of epoxy resins, PEO, polyanilines, polymethyl methacrylate, polystyrenes, polydienes, and plasma polymers derived from saturated or unsaturated alcohols, ketones, aldehydes, amines or amides.

5. A process according to claim 1 where the substrate is a glass.

6. A process according to claim 1 wherein the substrate is selected from the group consisting of quartz glass, graphite, mica, mesaporous silica, silicon wafer, nanoporous alumina and ceramic plates.

7. The process according to claim 6 wherein the substrate is quartz glass or silicon wafer.

8. The process according to claim 1 wherein the substrate comprises a coating of a material which is capable of supporting carbon nanotube growth under the conditions employed.

9. The process according to claim 8 wherein the coating is selected from the group consisting of a metal, and metal alloys and compounds thereof having conducting or semi-conducting properties.

10. The process according to claim 9 wherein the coating is a metal selected from the group consisting of Au, Pt, Cu, Cr, Ni, Fe, Co and Pd.

11. The process according to claim 9 wherein the coating is a metal compound or metal alloy compound selected from an oxide, a carbide, a nitride, a sulfide and a boride.

12. The process according to claim 11 wherein the coating is a metal oxide selected from the group consisting of indium tin oxide (ITO), $Al_2O_3$, $TiO_2$ and MgO.

13. The process according to claim 9 wherein the coating is a semiconducting material selected from the group consisting of gallium arsenide, aluminium arsenide, aluminium sulphide and gallium sulphide.

14. A process according to claim 1 wherein the soft lithographic technique is a microcontact printing technique.

15. A process according to claim 14 wherein self-assembling monolayers (SAMS) of a molecular ink is applied to the surface of said substrate in a region specific manner, followed by adsorption of said polymeric material in the SAM-free regions.

16. A process according to claim 15 wherein the molecular ink is an alkylsiloxane.

17. A process according to claim 15 wherein the molecular ink is applied using a stamp.

18. A process according to claim 14 wherein the hydrophobicity and hydrophilicity of the surface of said substrate is altered by the region specific transfer to the surface of the substrate of a material which alters the hydrophobicity or hydropbiliclty of the surface, followed by the adsorption of the polymer in the more hydrophobic regions of the substrate surface.

19. A process according to claim 1 wherein the soft lithographic technique is a micromolding technique.

20. A process according to claim 19 wherein the micromolding technique comprises applying a thin layer of a solution of said polymeric material in a solvent to said substrate surface, sandwiching the solution between said substrate surface and a mold surface, said mold surface having incised areas corresponding to the pattern to be formed on the substrate surface, allowing the solvent to evaporate and removing the mold to provide a pattern of polymeric material on the substrate surface.

21. A process according to claim 20 wherein the mold is composed of PDMS, fluorocarbon or other solvent resistant elastomers.

22. A process according to claim 1 wherein the polymeric material is carbonized by heating to a temperature at or above a temperature at which said polymeric material decomposes.

23. The process according to claim 1 wherein the aligned carbon nanotubes are synthesised by pyrolysis of a carbon-containing material in the presence of a suitable catalyst for nanotube formation.

24. The process according to claim 23 wherein the carbon-containing material is selected from the group consisting of alkanes, alkenes, alkynes and aromatic hydrocarbons and derivatives thereof, organometailic compounds of transition metals and other suitable evaporable metal complexes.

25. The process according to claim 24 wherein the carbon-containing material is selected from the group consisting of methane, acetylene and benzene.

26. The process according to claim 24 wherein the organometallic compound is a transition metal phthalocyanine.

27. The process according to claim 24 wherein the organometallic compound is a metallocene.

28. The process according to claim 23 wherein the catalyst is a transition metal.

29. The process according to claim 28 wherein the transition metal is selected from the group consisting of Fe, Co, Al, Ni, Mn, Pd, Cr and alloys thereof in any suitable oxidation state.

30. The process according to claim 23 wherein the catalyst is incorporated in the carbon-containing material.

31. The process according to claim 30 wherein the catalyst is selected from the group consisting of Fe(II) phthalocyanine, Ni(II) phthalocyanine and ferrocene.

32. The process according to claim 30 further comprising an additional source of catalyst.

33. The process according to claim 30 further comprising an additional source of carbon-containing material.

34. The process according to claim 23 wherein the pyrolysis is carried out at 500° C. to 1100° C.

35. The process according to claim 1 wherein the process comprises a further step of dissociating the aligned carbon nanotubes from the substrate.

36. The process according to claim 35 wherein the substrate is quartz glass and dissociation is effected by immersing the sample in an aqueous hydrofluoric acid solution (10–40% w/w).

37. The process according to claim 35 wherein dissociation comprises transferring he patterned carbon nanotube layer to another substrate.

38. The process according to claim 37 wherein the other substrate is elected from the group consisting of another substrate capable of supporting carbon nanotube growth, a metal, a metal oxide, a semiconductor material and a polymer.

39. The process according to claim 38 wherein the polymer is selected from the group consisting of adhesive coated polymers, conjugated (conducting) polymers, temperature/pressure responsive polymers, bioactive polymers and engineering resins.

40. The process according to claim 39 wherein the adhesive coated polymer is cellulose.

\* \* \* \* \*